(12) United States Patent
Doi

(10) Patent No.: US 6,577,318 B1
(45) Date of Patent: Jun. 10, 2003

(54) INTEGRATED CIRCUIT DEVICE AND DISPLAY DEVICE WITH THE SAME

(75) Inventor: Nobuyasu Doi, Shiga (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/469,195

(22) Filed: Dec. 21, 1999

(30) Foreign Application Priority Data

Dec. 22, 1998 (JP) .......................................... 10-364337

(51) Int. Cl.[7] .......................... G06T 11/00; G06F 13/00; G06F 12/02
(52) U.S. Cl. ...................... 345/565; 345/467; 345/537; 345/571
(58) Field of Search .............................. 345/12, 13, 74, 345/189, 565, 566, 558, 554, 537, 564, 571, 467; 313/495, 493

(56) References Cited

U.S. PATENT DOCUMENTS

| | | | | |
|---|---|---|---|---|
| 3,735,383 A | * | 5/1973 | Naka | 345/12 |
| 4,408,197 A | * | 10/1983 | Komatsu et al. | 340/720 |
| 5,036,247 A | * | 7/1991 | Watanabe et al. | 313/496 |
| 5,172,028 A | * | 12/1992 | Watanabe | 313/495 |
| 5,311,211 A | * | 5/1994 | Simpson | 345/189 |
| 5,323,175 A | * | 6/1994 | Doi et al. | 345/467 |
| 5,459,374 A | * | 10/1995 | Thoeny et al. | 315/169.1 |
| 5,610,622 A | * | 3/1997 | Takeda et al. | 345/13 |
| 5,701,134 A | * | 12/1997 | Lambert et al. | 345/74 |
| 5,793,158 A | * | 8/1998 | Wedding, Sr. | 313/493 |
| 5,952,985 A | * | 9/1999 | McKinney et al. | 345/42 |
| 6,078,316 A | * | 6/2000 | Page | 345/204 |

OTHER PUBLICATIONS

M. Ishidoh, et al., "FIP™ Controller and Driver", NEC Corporation (1992).

* cited by examiner

Primary Examiner—Bipin Shalwala
Assistant Examiner—David L. Lewis
(74) Attorney, Agent, or Firm—Choate, Hall & Stewart

(57) ABSTRACT

An integrated circuit device includes a first memory unit and a conversion part for converting the parallel data read from the first memory unit into serial data. The integrated circuit device also includes a second memory unit that can write and read the data indicating the order of reading the parallel data from the first memory unit and the order of converting the parallel data into the serial data.

14 Claims, 7 Drawing Sheets

| A1 | A2 | A3 | A4 | A5 |
|----|----|----|----|----|
| A6 | A7 | A8 | A9 | A10 |
| A11 | A12 | A13 | A14 | A15 |
| A16 | A17 | A18 | A19 | A20 |
| A21 | A22 | A23 | A24 | A25 |
| A26 | A27 | A28 | A29 | A30 |
| A31 | A32 | A33 | A34 | A35 |
| A36 | A37 | A38 | A39 | A40 |

FIG. 5
(PRIOR ART)

| RAW \ COLUMN | C0 | C1 (302) | C2 | C3 | C4 | READING ORDER | SERIAL DIRECTION |
|---|---|---|---|---|---|---|---|
| R0 | A1 | A2 | A3 | A4 | A5 | 1 | FROM C0 |
| R1 | A6 | A7 | A8 | A9 | A10 | 2 | FROM C0 |
| R2 | A11 | A12 | A13 | A14 | A15 | 3 | FROM C0 |
| R3 | A16 | A17 | A18 | A19 | A20 | 4 | FROM C0 |
| R4 | A21 | A22 | A23 | A24 | A25 | 5 | FROM C0 |
| R5 | A26 | A27 | A28 | A29 | A30 | 6 | FROM C0 |
| R6 | A31 | A32 | A33 | A34 | A35 | 7 | FROM C0 |
| R7 | A36 | A37 | A38 | A39 | A40 | 8 | FROM C0 |

FIG. 8

| RAW \ COLUMN | C0 | C1 407 | C2 | C3 | C4 | READING ORDER | SERIAL DIRECTION |
|---|---|---|---|---|---|---|---|
| R0 | A1 | A2 | A3 | A4 | A5 | 8 | FROM C4 |
| R1 | A6 | A7 | A8 | A9 | A10 | 3 | FROM C0 |
| R2 | A11 | A12 | A13 | A14 | A15 | 4 | FROM C0 |
| R3 | A16 | A17 | A18 | A19 | A20 | 7 | FROM C0 |
| R4 | A21 | A22 | A23 | A24 | A25 | 6 | FROM C4 |
| R5 | A26 | A27 | A28 | A29 | A30 | 5 | FROM C4 |
| R6 | A31 | A32 | A33 | A34 | A35 | 2 | FROM C4 |
| R7 | A36 | A37 | A38 | A39 | A40 | 1 | FROM C4 |

FIG. 9

| RAW \ COLUMN | c0 | c1 | c2 | c3 |
|---|---|---|---|---|
| r0 | 1 | 1 | 1 | 1 |
| r1 | 1 | 1 | 1 | 0 |
| r2 | 0 | 0 | 0 | 1 |
| r3 | 0 | 0 | 1 | 0 |
| r4 | 1 | 1 | 0 | 1 |
| r5 | 1 | 1 | 0 | 0 |
| r6 | 1 | 0 | 1 | 1 |
| r7 | 1 | 0 | 0 | 0 |

408

INTEGRATED CIRCUIT DEVICE AND DISPLAY DEVICE WITH THE SAME

BACKGROUND OF THE INVENTION

1. Field of the Invention

The present invention relates to an integrated circuit device for driving a flat display board or the like.

2. Description of the Related Art

A fluorescent display module is built in a dot character type fluorescent display device which is a flat display unit. FIG. 1 is a schematic diagram showing a conventional fluorescent display module. FIG. 2 is a schematic illustration showing one divided display part 110 in FIG. 1. FIG. 3 is a schematic illustration showing anode lines 102 in FIG. 1.

As shown in FIG. 1, a conventional fluorescent display module is provided with a fluorescent character display tube 100 which is a flat display board, and an integrated circuit device 300 for driving the fluorescent character display tube 100. The fluorescent character display tube 100 has a capability of displaying, for example, 15-digit alphanumeric characters and katakanas (angular Japanese phonetic syllabary). Such a fluorescent character display tube 100 includes fifteen divided display parts 110. One divided display part 110 is composed of 5(crosswise)×8(lengthwise) dots of minimum light emission display. Each of 5(crosswise)×8(lengthwise) anodes 101 (A1–A40) is composed of one dot of minimum light emission unit, as shown in FIG. 2.

The fluorescent character display tube 100 includes, as shown in FIG. 1, input terminals 103 (AI1–AI40), and forty anode lines 102 are connected to the input terminals AI1–AI40, respectively. The anodes 101, which are disposed at the same position at each digit, are commonly connected to respective input terminal 103 (AI1–AI40) by the anode lines 102, as shown in FIG. 3. For example, fifteen anodes A5 are connected to the input terminal AI5 by one anode line 102.

Furthermore, the fluorescent character display tube 100 includes, as shown in FIG. 1, input terminals 106 (GI1–GI15), and fifteen grid lines 105 are connected to the input terminals GI1–GI15, respectively. Each digit has one grid 104 (GI1–GI15) as a digit electrode, which is connected to the input terminals 106 (GI1–GI15), respectively.

The integrated circuit device 300 has output terminals 311 (ao1–ao40) and 312 (go1–go15). From the output terminals 311 (ao1–ao40), outputted are anode voltages that drive the anodes 101 corresponding to a display pattern. From the output terminals 312 (go1–go15), outputted is a grid voltage that drives each grid 104 by time-sharing.

The fluorescent character display tube 100 and the integrated circuit device 300 are mounted on a printed circuit board (not shown). On the printed circuit board, there are provided wirings 325 for connecting the input terminals 103 of fluorescent character display tube 100 and the output terminals 311 of integrated circuit device 300. There are provided with, on the printed circuit board, wirings 326 for connecting the input terminals 106 of fluorescent character display tube 100 and the output terminals 312 of integrated circuit device 300.

FIG. 4 is a block diagram showing the integrated circuit device 300 in FIG. 1.

The integrated circuit device 300 includes a control part 301 that inputs and outputs various signals including display data for the fluorescent character display tube 100. The integrated circuit device 300 also includes a memory part 302 that consists of RAM for writing and reading display data and the like and ROM for reading only according to output signals from the control part 301. Furthermore, the integrated circuit device 300 includes an anode drive part 303 for outputting anode voltages according to the display data read from the memory part 302 and obtained via the control part 301, and a grid drive part 304 for outputting grid voltages sequentially to each grid 104 by time sharing, based on timing signals from the control part 301.

The control part 301 has a counting part 305 for reading display data from the memory part 302 as parallel data according to a count signal, and a parallel/serial conversion part 306 for outputting parallel data converted into serial data. To the output side of anode drive part 303, connected is the output terminals 311 (ao1–ao40) for anode voltage, and to the output side of grid drive part 304, the output terminals 312 (go1–go15) for grid voltage is connected.

FIG. 5 is an illustration showing data stored in the memory part 302 in a conventional integrated circuit device 300.

As shown in FIG. 5, in the memory part 302, stored are 5(crosswise)×8(lengthwise) bits of display data to be displayed at each digit of the fluorescent character display tube 100. The address of display data at each bit is designated by the row address R0–R7 and the column address C0–C4 corresponding to the anode A1–A40.

Now, operations of the conventional fluorescent display module configured as mentioned above will be described.

When a count signal from the counting part 305 is supplied for the memory part 302, the display data of the digits to be displayed are read sequentially from the memory part 302 as parallel data for each 5 bits of column addresses C0–C4, from the row addresses R0 through the row addresses R7. The read parallel data are outputted after their 5-bit data have been serialized by the parallel/serial conversion part 306, from the C0 side toward the C4 side of column address. The serial data are inputted sequentially into a shift register included in the anode drive part 303. Once all of the 5(crosswise) ×8(lengthwise) bits of display data have been inputted into the shift register, anode voltages for anodes A1–A40 are outputted simultaneously from the output terminals 311 (ao1–ao40). At the same time, a timing signal is supplied from the control part 301 to the grid drive part 304, and grid voltages from the output terminals 312 (go1–go15) are applied to the digits that are driven in response with the timing signal.

Successively in the same fashion, an anode voltage and a grid voltage are sequentially supplied to respective anode 101 and grid 104 of each digit by a dynamic grid drive by time-sharing, and thus predetermined characters or the like are displayed.

Next, description is given of a printed circuit board on which the integrated circuit device 300 is mounted. FIG. 6 is a schematic diagram showing the relationship between the printed circuit board and the integrated circuit device 300 in a conventional fluorescent display module.

The integrated circuit device 300 is disposed on the underside of the printed circuit board 320. On the periphery of integrated circuit device 300, the output terminals 311 (ao1–ao40) corresponding to the anodes 101 (A1–A40) of fluorescent character display tube 100 are disposed in the counterclockwise order. The output terminals 312 (go1–go15) corresponding to the grids 104 for fifteen digits are disposed in the clockwise order on the periphery of integrated circuit device 300. These positions are determined at the designing stage. Besides, other input terminals and power supply terminals (not shown) are also disposed on other regions of the periphery of integrated circuit device 300. Within the integrated circuit device 300, the above-mentioned circuits are electrically connected to the terminals.

The printed circuit board 320 includes forty input terminals 321 to which the output terminals 311 of integrated circuit device 300 are connected, and fifteen input terminals 322 to which the output terminals 312 of integrated circuit device 300 are connected. The printed circuit board 320 further includes forty output terminals 323 to which the input terminals 103 of fluorescent character display tube 100 are connected, and fifteen output terminals 324 to which the input terminals 106 of fluorescent character display tube 100 are connected. The printed circuit board 320 includes forty wirings 325 which connect each input terminal 321 to each output terminal 323, and fifteen wirings 326 that connects each input terminal 322 with each output terminal 324.

The forty wirings 325, which are connected to the output terminals ao1–ao40 of integrated circuit device 300 via the input terminals 321, are connected to the output terminal 323 corresponding to the input terminals AI1–AI40 of fluorescent character display tube 100, respectively. Likewise, the fifteen wirings 326, which are connected to the output terminals go1–go15 of integrated circuit device 300 via the input terminals 322, are connected to the output terminals 324 corresponding to the input terminals GI1–GI15 of the fluorescent character display tube 100, respectively. In FIG. 6, the solid lines representative of wiring 325 and 326 indicate that the wiring is disposed on the surface side of printed circuit board 320, and the broken lines representative of wiring 325 and 326 indicate that the wiring is disposed on the underside of printed circuit board 320.

In general, the positions where the input terminals of fluorescent character display tube are disposed, are designed by makers of fluorescent character display tubes allowing for the shape and size. On the other hand, the positions where the output terminals of integrated circuit device are disposed, are designed by makers of integrated circuit device. This creates a problem as follows. When a fluorescent character display tube and an integrated circuit device are mounted on a printed circuit board by a maker of fluorescent display module, the interconnection between the input terminals of printed circuit board corresponding to the positions of output terminals determined at the designing stage by the maker of integrated circuit device, and the output terminals of printed circuit board corresponding to the positions of input terminals determined at the designing stage by the maker of fluorescent character display tube, must be executed by multiple wiring.

For this reason, except when a maker of fluorescent display module designates the positions of output terminals of integrated circuit device to a maker of integrated circuit device maker so that the wiring to the positions of input terminals can be handled in a simple manner, the wirings on the printed circuit board must be routed so as to meet the positioning of output terminals determined by the maker of integrated circuit device, as long as an integrated circuit device for general purpose use is used.

For example, when the input terminals 321 and 322 as well as output terminals 323 and 324 are disposed on the printed circuit board 320 as shown in FIG. 6, the input terminals 322 and the output terminals 324 are, as to grids, positioned opposed in a one-to-one correspondence; this enables the wiring 326 to be simpler and shorter. As to anodes, however, the input terminals 321 and the output terminals 323 are not always positioned opposed in a one-to-one correspondence, and hence a complicated routing of the wiring 325 is required. Specifically, in order to prevent the wiring from intersecting each other, part of the wiring is located on both the surface side and underside of the printed circuit board 320. Most of the wiring is routed on the underside of integrated circuit device 300, but some of the wiring is routed on the periphery of integrated circuit device 300. This results in the increase in wiring region on the printed circuit board 320.

SUMMARY OF THE INVENTION

Accordingly, it is an object of the present invention to provide an integrated circuit device that allows a user to arbitrarily select the position of the input terminal of printed circuit board to be connected to each output terminal for an anode, and that allows the wiring on the printed circuit board to be simpler and reduced in wiring region.

According to one aspect of the present invention, an integrated circuit device comprises a first memory unit, a conversion part which converts parallel data read from the first memory unit into serial data, and a second memory unit. The second memory unit can write and read data indicating an order of reading the parallel data from the first memory unit and an order of converting the parallel data into the serial data.

In the present invention, the second memory unit is disposed between the counting part and the first memory unit and the reading order and the serial direction thereof are designated. Therefore, the correspondence between the address of dots and output terminals can be arbitrarily set up, when outputting display data that drive dots of minimum light emission unit in matrix configuration on the flat display board, from the display data output terminals of integrated circuit board. Consequently, when assembling a fluorescent display module, the display data input terminals of the flat display board and the display data output terminals of integrated circuit device can be positioned opposed in a one-to-one correspondence. Furthermore, the electrical interconnection between the display data input terminals of flat display board and the display data output terminals of integrated circuit device can be executed in a simpler wiring. Moreover, the decreased wiring area can reduce the manufacturing cost of printed circuit board.

BRIEF DESCRIPTION OF THE DRAWINGS

The above and other objects, features and advantages of the present invention will be apparent from the following detailed description of the preferred embodiment of the invention in conjunction with the accompanying drawings, in which:

FIG. 5 is an illustration showing data stored in a memory part 302 within a conventional integrated circuit device 300;

FIG. 8 is an illustration showing data stored in a first memory unit within the integrated circuit device in accordance with the preferred embodiment of the present invention;

FIG. 9 is an illustration showing data stored in a second memory unit within the integrated circuit device in accordance with the preferred embodiment of the present invention.

DETAILED DESCRIPTION OF THE PREFERRED EMBODIMENTS

Figures 1, 2:
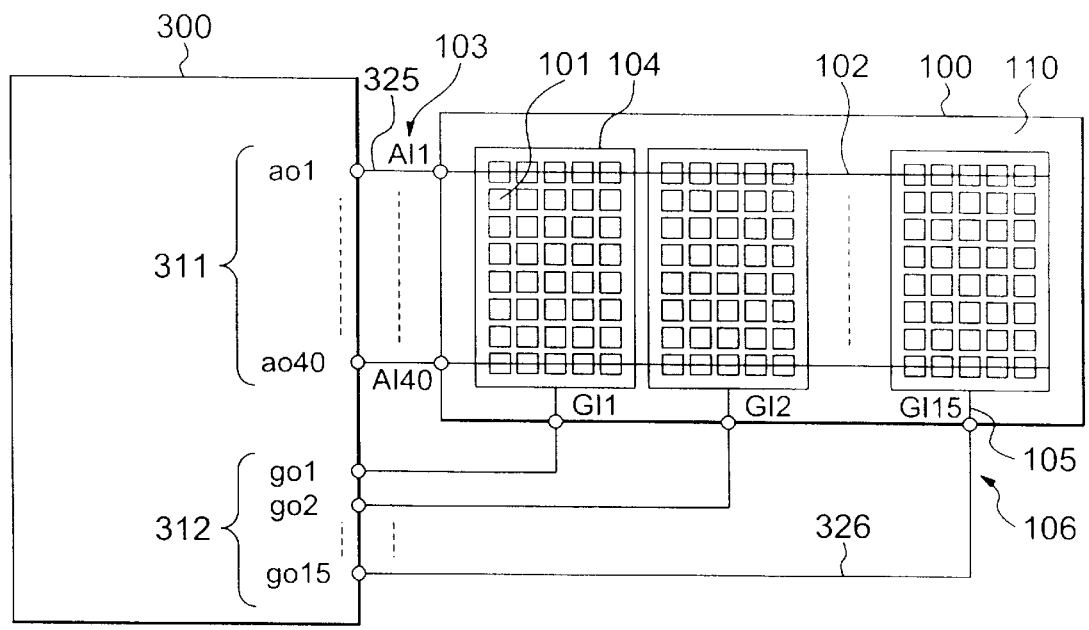
FIG. 1 is a schematic diagram showing a conventional fluorescent display module.
FIG. 2 is a schematic illustration showing one divided display part 110 in FIG. 1.
Figure 3:
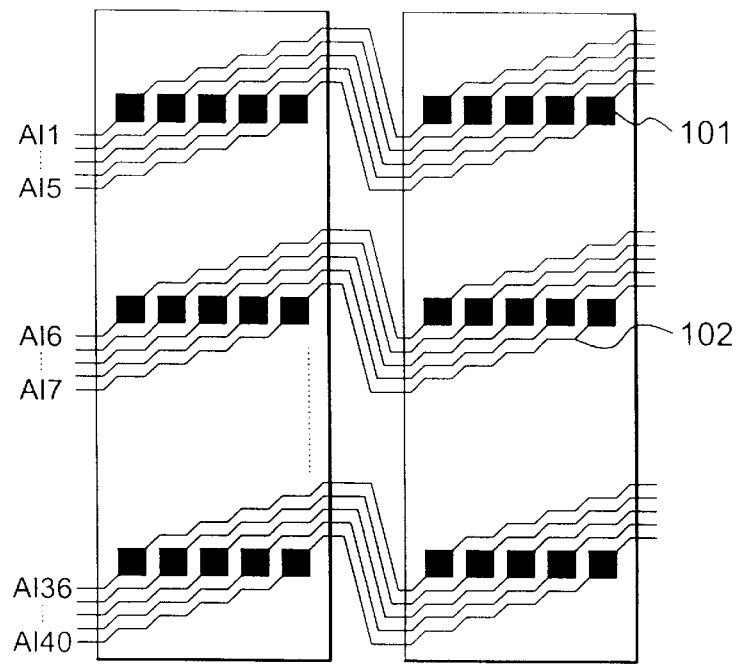
FIG. 3 is a schematic illustration showing anode lines 102 in FIG. 1.
Figure 4:
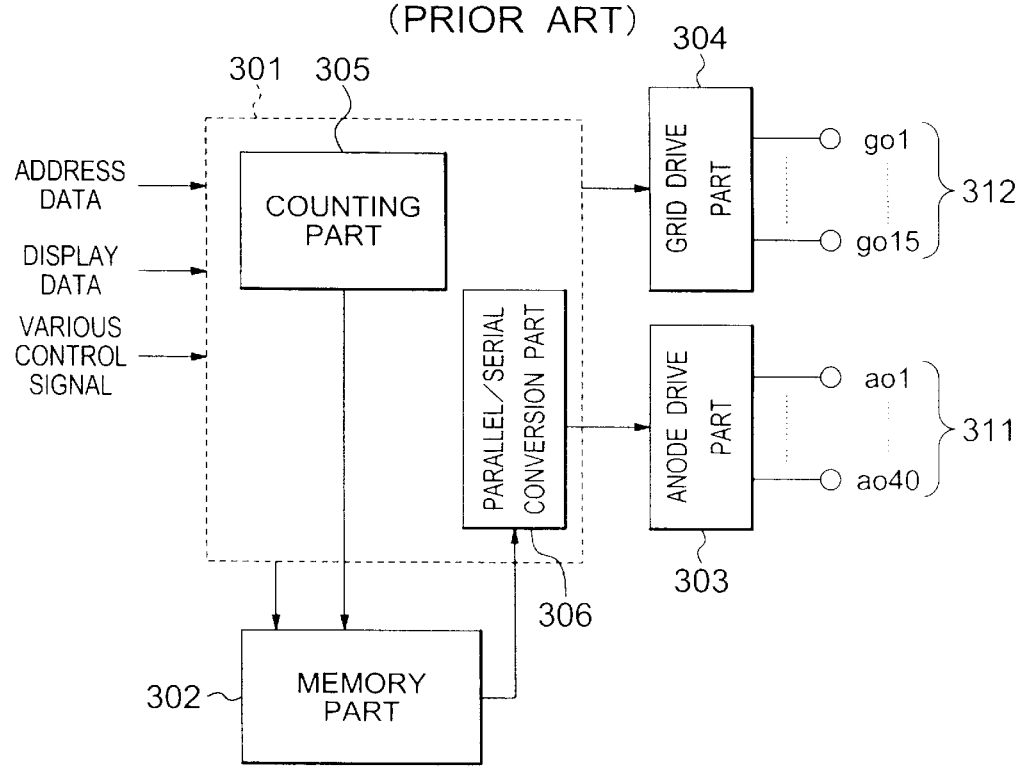
FIG. 4 is a block diagram showing the integrated circuit device 300 in FIG. 1.
Figure 6:
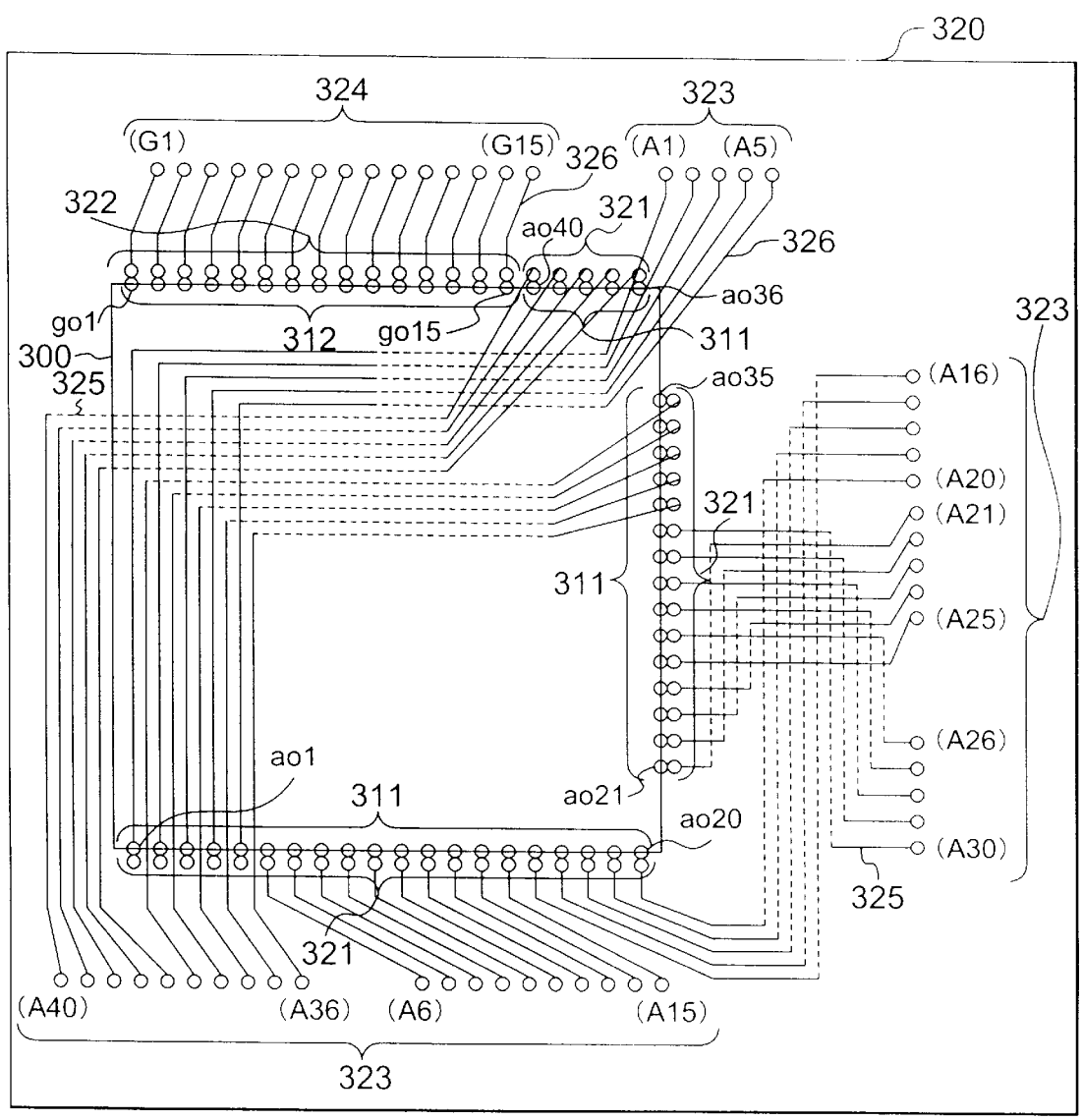
FIG. 6 is a schematic diagram showing the relationship between the printed circuit board and the integrated circuit device 300 in a conventional fluorescent display module.
Figure 7:
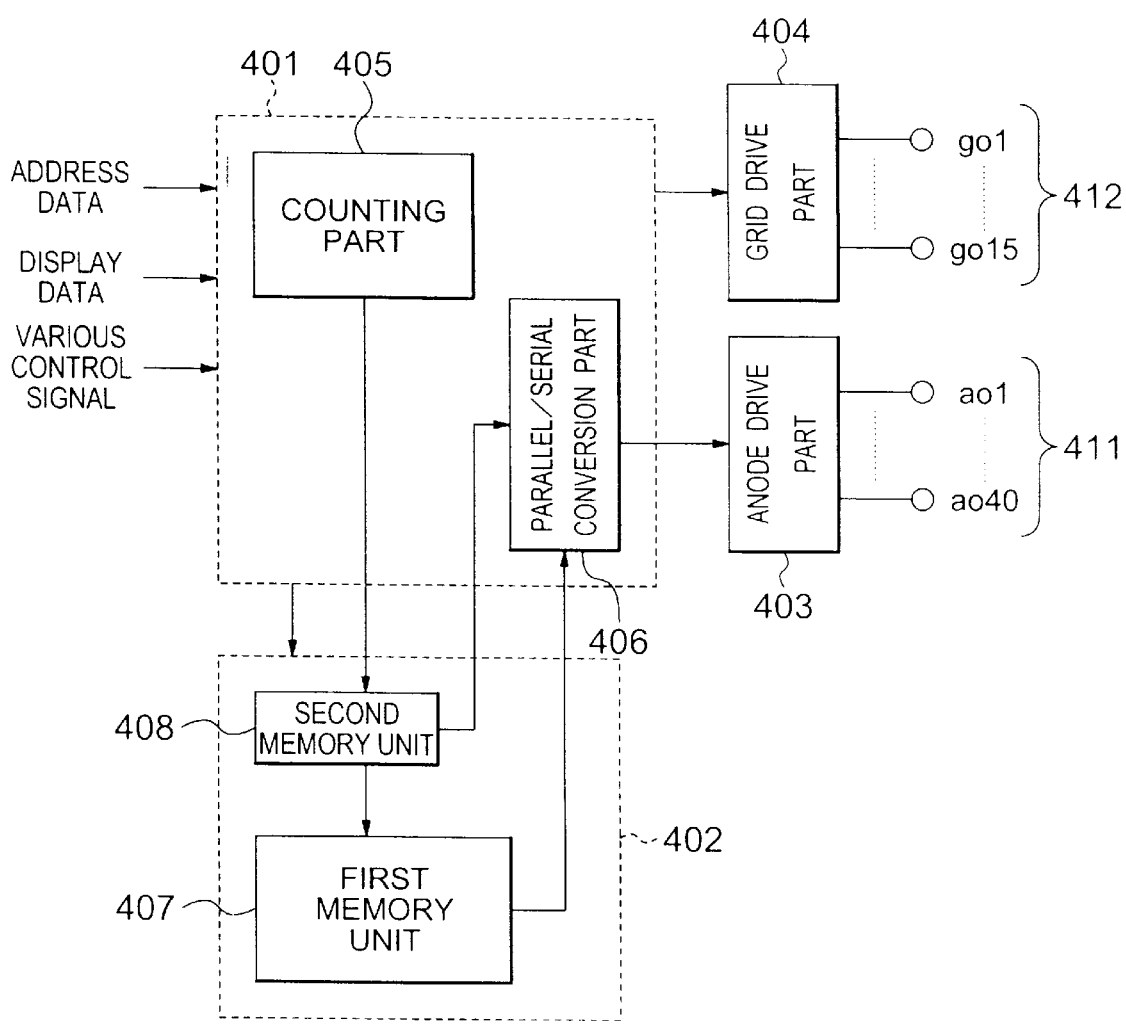
FIG. 7 is a block diagram of the integrated circuit device in accordance with a preferred embodiment of the present invention.

FIG. 7 is a block diagram of the integrated circuit device 400 in accordance with a preferred embodiment of the present invention, which drives the fluorescent display tube 100 in FIG. 1.

The integrated circuit device 400 in accordance with the preferred embodiment of the present invention includes a control part 401 that inputs and outputs various signals including data for displaying the fluorescent character display tube 100. The integrated circuit device 400 also includes a memory part 402 for writing and reading display data and the like according to signals from the control part 401. Furthermore, the integrated circuit device 400 includes an anode drive part 403 for outputting anode voltages according to the display data read from the memory part 402 and obtained via the control part 401, and includes a grid drive part 404 for outputting grid voltages sequentially to each grid 104 by time sharing, based on timing signals from the control part 401.

The control part 401 is provided with a counting part 405 for reading display data from the memory part 402, as parallel data, according to a count signal, and a parallel/serial conversion part 406 for converting parallel data into serial data and outputting them. To the output side of anode drive part 403, connected are the output terminals 411 (ao1–ao40) for anode voltages, and to the output side of grid drive part 404, the output terminals 412 (go1–go15) for grid voltages.

The memory part 402 is provided with a first memory unit 407 consisting of RAM or ROM that stores display data, and a second memory unit 408 consisting of RAM that stores data that designate the reading order of display data from the first memory unit 407 and the serial direction of serial data at the parallel/serial conversion part 406. The data stored in the second memory unit 408 are read according to a count signal from the counting part 405.

FIG. 8 is an illustration showing data stored in the first memory unit 407 in the integrated circuit device 400. FIG. 9 is an illustration showing data stored in the second memory unit 408 in the integrated circuit device 400.

As shown in FIG. 8, in the first memory unit 407, stored are 5(crosswise)×8(lengthwise) bits of display data to be displayed at each digit of the fluorescent character display tube 100. The address of display data at each bit is designated by the row address R0–R7 and the column address C0–C4 corresponding to the anode A1–A40.

On the other hand, as shown in FIG. 9, in the second memory unit 408, stored are data that designate the order of reading display data stored in the first memory unit 407. For example, the data that designate the order of reading the display data of 5 bits per column, stored in the column addresses C0–C4, are stored as 3-bit data in the row addresses r0–r7 and the column addresses c1–c3. The display data of 5 bits per column, stored in the column addresses C0–C4 of the first memory unit 407, are read as 1-byte parallel data. And, for example, the data that designate the serial direction when converting display data from parallel data for each byte into serial data are stored as 1-bit data in the row addresses r0–r7 and the column address c0. By the 1-bit data, whether the serial direction is, for example, "the direction from the address C0 to the address C4" or "the direction from the address C4 to the address C0" is determined.

Next, description is given of operations of the integrated circuit device 400 in accordance with the preferred embodiment of the present invention configured as mentioned above.

When a first count signal from the counting part 405 is supplied for the second memory unit 408, the data stored in the row address r0 and the column addresses c0–c3 of the second memory unit 408 are read. Next, the 3-bit data "111" of the row address r0 and the column addresses c1–c3 are supplied for the first memory unit 407 as reading order data, as well as the 1-bit data "1" of the column address c0 are supplied for the parallel/serial conversion part 406 as serial direction data.

When the reading order data "111" is supplied for the first memory unit 407, the data stored in the row address R7 corresponding to the reading order data "111" out of the row addresses R0–R7 and the column addresses C0–C4 are read, and supplied for the parallel/serial conversion part 406.

The parallel data from the row address R7 and column addresses C0–C4 supplied for the parallel/serial conversion part 406, are serialized into the direction from the address C4 to the address C0, based on the serial direction data "1" in row address r0. And the serialized data are outputted as the display data of anodes A40–A36.

When a next count signal from the counting part 405 is supplied for the second memory unit 408, the data stored in the row address r1 and the column addresses c0–c3 of the second memory unit 408 are read. Next, the 3-bit data "110" in the row address r1 and the column addresses c1–c3 are supplied for the first memory unit 407 as reading order data, as well as the 1-bit data "1" in the column address c0 are supplied for the parallel/serial conversion part 406 as serial direction data.

When the reading order data "110" is supplied for the first memory unit 407, the data stored in the row address R6 corresponding to the reading order data "110" out of the row addresses R0–R7 and the column addresses C0–C4 are read, and supplied for the parallel/serial conversion part 406.

The parallel data from the row address R6 and column addresses C0–C4 supplied for the parallel/serial conversion part 406, are serialized into the direction from the address C4 to the address C0, based on the serial direction data "1" in the row address r1. And the serialized data are outputted as the display data of anodes A35–A31.

Successively in the same fashion, when a count signal from the counting part 405 is supplied for the second memory unit 408, the data stored in the column addresses c0–c3 of the second memory unit 408 are read in the order from r2 to r7 of row addresses. And, the 3-bit data in the column addresses c1–c3 are supplied for the first memory unit 407 as reading order data, as well as the 1-bit data in the column address c0 are supplied for the parallel/serial conversion part 406 as serial direction data.

When 3-bit reading order data is supplied for the first memory unit 407, the data stored in those row addresses which corresponds to the reading order data out of the row addresses R0–R7 and the column addresses C0–C4 are read, and supplied for the parallel/serial conversion part 406.

The parallel data from the column addresses C0–C4 supplied for the parallel/serial conversion part 406, are serialized, based on 1-bit data (serial direction data) in the column address c0. If the serial direction data from the column address c0 are 0, parallel data are serialized in the direction from the address C0 to the address C4, and if the serial direction data are 1, parallel data are serialized in the direction from the address C4 to the address C1.

When the data shown in FIG. 9 are stored in the second memory unit 408, the data in the first memory unit 407 that are read thirdly are stored in the row address R1, after which the data are read in the order of the row addresses R2, R5, R4, R3, and R0. The serial direction of data stored in the row address R1 or R2 is one from the address C0 to the address C4. On the other hand, the serial direction of data stored in the row address R5, R4, R3 or R0 is one from the address C4 to the address C0.

The serialized data are, therefore, outputted as the display data in the order of the anodes A6–A10, anodes A11–A15, anodes A30–A26, anodes A25–A21, anodes A20–A16, and anodes A5–A1.

Thereafter, serial data are sequentially input to a shift register included in the anode drive part 403. Once all of the 5(crosswise)×8(lengthwise) bits of display data have been input into the shift register, each anode voltage is simultaneously output from each output terminal 411. At this time, the anode voltages from the output terminals ao1–ao5 are supplied for the anodes A40–A36, and the anode voltages from the output terminals ao6–ao10 are supplied for the anodes A35–A31. The anode voltages from the output terminals ao11–ao15 are supplied for the anodes A6–A10, and the anode voltages from the output terminals ao16–ao20 are supplied for the anodes A11–A15. The anode voltages from the output terminals ao21–ao25 are supplied for the anodes A30–A26, and the anode voltages from the output terminals ao26–ao30 are supplied for the anodes A25–A21. And, the anode voltages from the output terminals ao31–ao35 are supplied for the anodes A20–A16, and the anode voltages from the output terminals ao36–ao40 are supplied for the anodes A5–A1.

Concurrently with the outputs of these anode voltages, the timing signals from the control part 401 are supplied for the grid drive part 404, and the grid voltages from the output terminals 412 (go1–go15) are applied to the digits that are driven in response with the timing signals.

Successively in the same fashion, anode voltages and grid voltages are sequentially supplied to the anodes 101 and grids 104 of each digit respectively by a dynamic grid drive by time-sharing, and thus the predetermined characters or the like are displayed.

Figure 10:
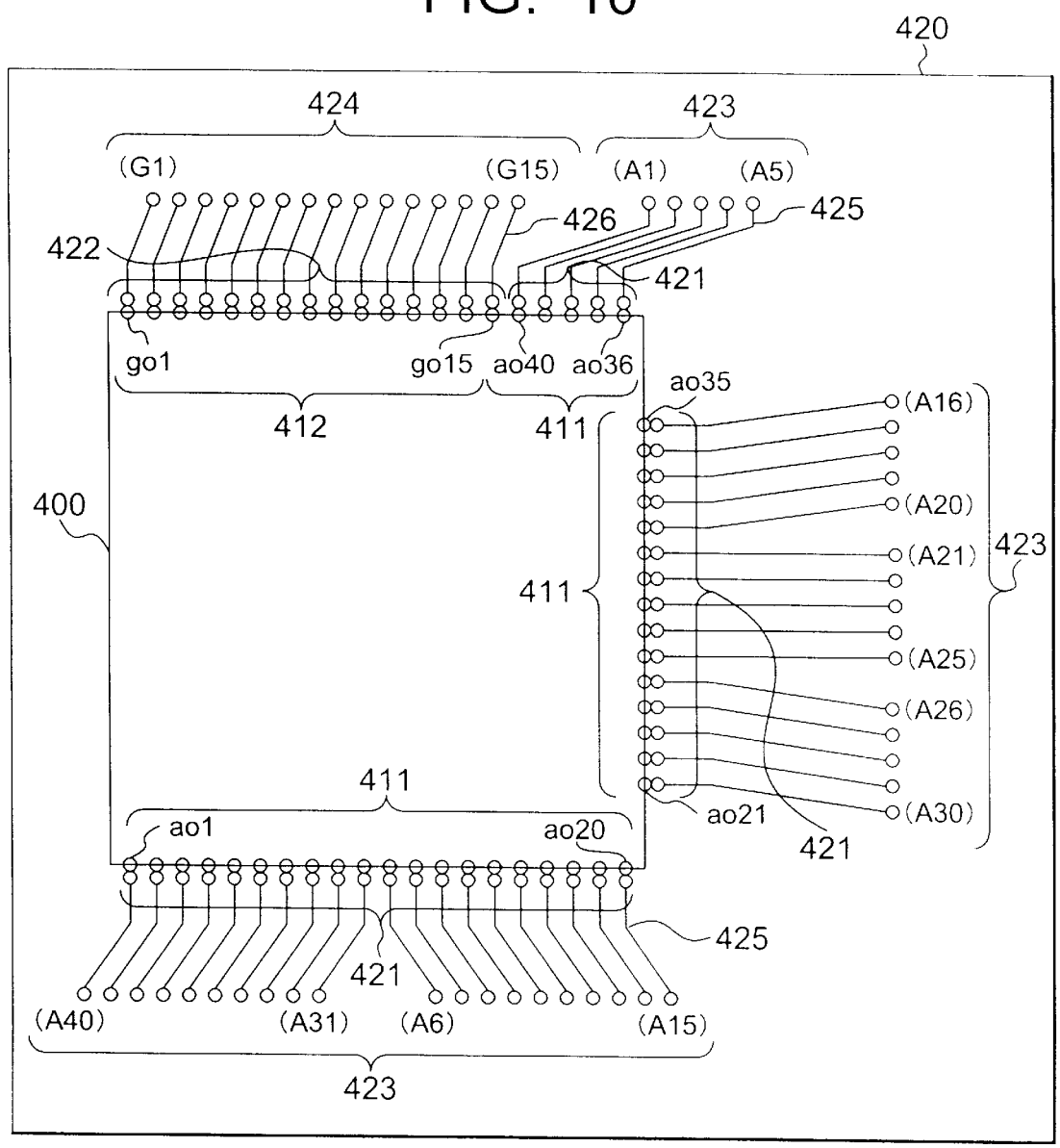
FIG. 10 is a schematic diagram showing the relationship between the integrated circuit device and the printed circuit board in accordance with the preferred embodiment of the present invention.

Next, description is given of a printed circuit board on which the integrated circuit device 400 is mounted. FIG. 10 is a schematic diagram showing the relationship between the integrated circuit device 400 and the printed circuit board in accordance with the preferred embodiment of the present invention.

The integrated circuit device 400 is disposed on the underside of the printed circuit board 420. For example, the positions of output terminals 411 and 412 of the integrated circuit device 400 are the same with the positions of output terminals 311 and 312 of the conventional integrated circuit device 300, respectively. Furthermore, the positions of input terminals 103 and 106 of the fluorescent character display tube 100 are also the same with the positions in the case of conventional fluorescent character display tube. Therefore, the positions on the printed circuit board 420, of forty input terminals 421 and fifteen input terminals 422 to be connected to the output terminals 411 and 412 of the integrated circuit device 400 are also the same with the positions in the case of conventional device, respectively. Likewise, the positions of forty output terminals 423 and fifteen input terminals 424 to be connected to the input terminals 103 and 106 of the fluorescent display tube device 100 are also the same with the positions in the case of the conventional device, respectively.

When, as described above, data are stored in the second memory unit 408 and each terminal is disposed on the printed circuit board 420, wirings 425 and 426 are provided on the printed circuit board 420 as follows:

The wirings 426 between the input terminals 422 and output terminals 424 are provided in the same way as the conventional case. Specifically, as to grids, since the input terminals 422 and the output terminals 424 are positioned opposed in a one-to-one correspondence, the simpler and shorter wirings 426 are provided.

On the other hand, as to anodes, the five input terminals 421 to which the output terminals ao1–ao5 are connected, are connected, by the wirings 425, to the respective five output terminals 423 to which the input terminals AI40–AI36 are connected. Likewise, the five input terminals 421 to which the output terminals ao6–ao10 are connected, are connected, by the wirings 425, to the respective five output terminals 423 to which the input terminals AI35–AI31 are connected. The five input terminals 421 to which the output terminals ao11–ao15 are connected, are connected, by the wirings 425, to the respective five output terminals 423 to which the input terminals AI6–AI10 are connected. The five input terminals 421 to which the output terminals ao16–ao20 are connected, are connected, by the wirings 425, to the respective five output terminals 423 to which the input terminals AI11–AI15 are connected. The five input terminals 421 to which the output terminals ao21–ao25 are connected, are connected, by the wirings 425, to the respective five output terminals 423 to which the input terminals AI30–AI26 are connected. The five input terminals 421 to which the output terminals ao26–ao30 are connected, are connected, by the wirings 425, to the respective five output terminals 423 to which the input terminals AI25–AI21 are connected. The five input terminals 421 to which the output terminals ao31–ao35 are connected, are connected, by the wirings 425, to the respective five output terminals 423 to which the input terminals AI20–AI16 are connected. The five input terminals 421 to which the output terminals ao36–ao40 are connected, are connected, by the wirings 425, to the respective five output terminals 423 to which the input terminals AI5–AI1 are connected.

In the present preferred embodiment, as described above, the anode voltages from the output terminals ao1–ao5 are supplied for the anodes A40–A36. The anode voltages from the output terminals ao6–ao10 are supplied for the anodes A35–A31. The anode voltages from the output terminals ao11–ao15 are supplied for the anodes A6–A10. The anode voltages from the output terminals ao16–ao20 are supplied for the anodes A11–A15. The anode voltages from the output terminals ao21–ao25 are supplied for the anodes A30–A26. The anode voltages from the output terminals ao26–ao30 are supplied for the anodes A25–A21. The anode voltages from the output terminals ao31–ao35 are supplied for the anodes A20–A16. The anode voltages from the output terminals ao36–ao40 are supplied for the anodes A5–A1. Therefore, the wirings 425 and 426 shown in FIG. 10 provide normal operations as well.

Thus, in accordance with the present preferred embodiment, there is provided the second memory unit 408 that can write and read data indicating the order of reading parallel data from the first memory unit 407 and the direction of serializing the parallel data at the parallel/serial conversion part 406. Therefore, by storing data such as the reading order in the second memory unit 408 so that the transfer of signals can be conducted between the input terminals and output terminals opposed in the printed circuit board 420, the correspondence between the output terminals 411 from which display data are outputted as anode voltages in the integrated circuit device 400 and the addresses in the first memory unit 407 can be arbitrarily set up.

In accordance with the present invention, the second memory unit is disposed between the counting part and the first memory unit and the reading order and the serial direction thereof are designated. Therefore, the correspondence between the address of dots and output terminals can be arbitrarily set up, when outputting display data that drive dots of minimum light emission unit in matrix configuration on the flat display board, from the display data output terminals of integrated circuit board. Consequently, when assembling a fluorescent display module, the display data input terminals of the flat display board and the display data output terminals of integrated circuit device can be positioned opposed in a one-to-one correspondence. Furthermore, the electrical interconnection between the display data input terminals of flat display board and the display data output terminals of integrated circuit device can be executed in a simpler wiring. Moreover, the decreased wiring area can reduce the manufacturing cost of printed circuit board.

While there has been described what are at present considered to be a preferred embodiment of the invention, it will be understood that various modifications may be made thereto, and it is intended that appended claims cover all such modification as fall within the true spirit and scope of the invention.

What is claimed is:

1. An integrated circuit device comprising:
a first memory unit including data organized into rows which may be read in parallel;
a conversion part which converts parallel data read from said first memory unit into serial data; and
a second memory unit that can write and read control data indicating an order of reading the rows of said parallel data from said first memory unit, said control data including a plurality of entries, each of said plurality of entries corresponding to a row number of said first memory unit and including a first portion and a second portion of control data, said first portion specifying said row number of said first memory unit, said second portion specifying a serial conversion direction indicating a row direction in which data of said row number of said first memory unit is converted when converting said parallel data into said serial data and output as display data, said order of reading said rows specified by a position of each of said plurality of entries relative to said other entries.

2. The integrated circuit device according to claim 1, wherein display data for a display board are stored in said first memory unit.

3. The integrated circuit device according to claim 1, comprising a counting part which outputs timing signals to adjust an action timing of said second memory unit.

4. The integrated circuit device according to claim 2, wherein
said display board has L divided display parts consisting of (m×n) dots such that m dots are arranged crosswise and n dots are arranged lengthwise,
n of said parallel data are read by m-bit unit, and
said integrated circuit device drives dynamically said display board by time sharing 1 frame of said display board into L times for each of said divided display part.

5. The integrated circuit device according to claim 4, comprising (m×n) output terminals that output signals converted by said conversion part.

6. The integrated circuit device according to claim 4, wherein said display board has a fluorescent character display tube mounted on a panel substrate, said fluorescent character display tube having anodes disposed for each of said dot, and applies anode voltages to said anodes based on said display data stored in said first memory unit.

7. The integrated circuit device according to claim 4, wherein said display board has a fluorescent character display tube mounted on a panel substrate, said fluorescent character display tube having anodes disposed for each of said dots, and grids disposed for each of said divided display parts, and applies anode voltages to said anodes based on said display data stored in said first memory unit each time impressing one of said grid voltages to each of said grids by time sharing.

8. A display device comprising:
a drive unit, said drive unit comprising:
a first memory unit including data organized into rows which may be read in parallel;
a conversion part which converts parallel data read from said first memory unit into serial data; and
a second memory unit that can write and read control data indicating an order of reading the rows of said parallel data from said first memory unit, said control data including a plurality of entries, each of said plurality of entries corresponding to a row number of said first memory unit and including a first portion and a second portion of control data, said first portion specifying said row number of said first memory unit, said second portion specifying a serial conversion direction indicating a row direction in which data of said row number of said first memory unit is converted when converting said parallel data into said serial data and output as display data, said order of reading said rows specified by a position of each of said plurality of entries relative to said other entries.

9. The integrated circuit device of claim 1, wherein said second memory unit is organized into rows, each of said rows corresponding to one of said plurality of ordered entries, each first portion is a number of bits representing a row number of said first memory unit, each second portion is a single bit flag.

10. The integrated circuit device of claim 9, wherein said serial conversion direction of each row indicates one of: converting data starting with a beginning to an end of said each row of said first memory unit, and converting data starting with the end of said each row to the beginning of said each row.

11. The integrated circuit device of claim 10, wherein said first memory unit has an nth row of data, an mth row in said second memory unit corresponds to said nth row of said first memory unit and includes a first portion of control data having the integer value "n" and a second portion of said control data having a bit flag value indicating that said mth row of data is converted from parallel data to serial data starting with an end of said mth row and ending with a beginning of said mth row, said control data of said mth row indicating that said nth row of data is said mth row of data read from said first memory unit, m and n being equal.

12. The display device of claim 8, wherein said second memory unit is organized into rows, each of said rows corresponding to one of said plurality of ordered entries, each first portion is a number of bits representing a row number of said first memory unit, each second portion is a single bit flag.

13. The display device of claim 12, wherein said serial conversion direction of each row indicates one of: converting data starting with a beginning to an end of said each row of said first memory unit, and converting data starting with the end of said each row to the beginning of said each row.

14. The display device of claim 13, wherein said first memory unit has an nth row of data, an mth row in said second memory unit corresponds to said nth row of said first memory unit and includes a first portion of control data having the integer value "n" and a second portion of said control data having a bit flag value indicating that said mth row of data is converted from parallel data to serial data starting with an end of said mth row and ending with a beginning of said mth row, said control data of said mth row indicating that said nth row of data is said mth row of data read from said first memory unit, m and n being equal.

* * * * *